United States Patent [19]
Yamaguchi

[11] Patent Number: 5,564,819
[45] Date of Patent: Oct. 15, 1996

[54] LED LAMP AND ARRANGEMENT FOR MOUNTING LED LAMPS ON A SUBSTRATE

[75] Inventor: Tomoji Yamaguchi, Kyoto, Japan

[73] Assignee: Rohm Co., Ltd., Kyoto, Japan

[21] Appl. No.: 411,541

[22] Filed: Mar. 28, 1995

[30] Foreign Application Priority Data

Apr. 4, 1994 [JP] Japan .................................. 6-066068

[51] Int. Cl.⁶ ........................................................ F21V 7/00
[52] U.S. Cl. ........................ 362/241; 362/252; 362/800; 362/247; 313/500; 313/512
[58] Field of Search .................................... 362/241, 247, 362/248, 249, 252, 237, 800, 311; 313/500, 512

[56] References Cited

U.S. PATENT DOCUMENTS

| | | | |
|---|---|---|---|
| 3,976,877 | 8/1976 | Thillays | 313/512 |
| 4,630,183 | 12/1986 | Fujita | 362/800 |
| 5,289,082 | 2/1994 | Komoto | 362/800 |
| 5,404,282 | 4/1995 | Klinke et al. | 362/800 |
| 5,490,048 | 2/1996 | Brassier et al. | 362/800 |

FOREIGN PATENT DOCUMENTS 3-51881  3/1991  Japan .

*Primary Examiner*—James C. Yeung
*Assistant Examiner*—Thomas M. Sember
*Attorney, Agent, or Firm*—Brumbaugh, Graves, Donohue & Raymond

[57] ABSTRACT

An LED lamp has a first lead formed with a reflecting plate at an upper end and a pair of further leads spaced on opposite sides of the first lead, and a plurality of LED chips mounted in linear spaced relation on the reflecting plate. The direction Y of the spacing of the plurality of LED chips is inclined at a predetermined angle α to the spacing direction X of the leads. The reflecting plate has an elongated shape and the plurality of LED chips are spaced in the direction of elongation of the reflecting plate.

6 Claims, 3 Drawing Sheets

5,564,819

LED LAMP AND ARRANGEMENT FOR MOUNTING LED LAMPS ON A SUBSTRATE

BACKGROUND OF THE INVENTION

This invention relates to LED lamps and to arrangements for mounting LED lamps on a substrate, and particularly to an arrangement for mounting LED lamps on a direction hoard, a signboard, or another LED display board.

The principal part of an LED dot matrix display unit which is used as a direction board, a signboard, or any other LED display board, which may he installed either indoors or outdoors, consists of an array of LED lamps arranged in horizontal and vertical rows on a substrate.

Each of the LED lamps in such an LED display unit has a structure conforming to its intended use. One such structure is shown in FIG. 5 by way of example. In the particular arrangement shown in FIG. 5, an LED lamp 50 has three leads 51–53 in the form of lead pins arranged to have their lower end portions soldered to a substrate. A concave reflecting plate 51a is formed at the upper end of the first lead 51 which is disposed at the center of the three lead pins.

Two LED chips 54 and 55 are bonded onto the reflecting plate 51a, and the LED chips 54 and 55 are also joined to the other leads 52 and 53 on opposite sides by two wires 52w and 53w, respectively. In the illustrated arrangement, the reflecting plate 51a is elongated in one direction to provide a long and narrow shape, and the two LED chips 54 and 55 are spaced in the direction of elongation of the reflecting plate 51a. The reflecting plate 51a is encapsulated in a sealing body 56 such as a body of transparent resin, colored transparent resin, dispersing agent containing resin, or the like.

Generally, the two LED chips 54 and 55 are chips which luminesce in different colors. For example, to provide a display in which the color of the LED lamp 50 resulting from the luminescence of both LED chips 54 and 55 is orange, the LED chip 54 has a red luminescent color, and the other LED chip 55 has a green luminescent color.

A plurality of such LED lamps 50 are arranged in horizontal and vertical rows on a substrate so as to constitute a unit module of the above-mentioned LED dot matrix display unit. A plurality of such unit modules are then arranged in horizontal and vertical rows adjacent to each other so as to provide a display unit. In use, this display unit is mounted on the wall of a building or the like and the operation of the arrays of LED lamps 50 is controlled electrically so that letters, drawings and other information are displayed on the exposed surface of the display unit.

When the display color of the LED lamp 50 appears orange by using a red LED chip 54 and a green LED chip 55 as in the above example, however, it is necessary to avoid a change in the display color of the LED lamp 50 when it is viewed from different directions.

In order to avoid such a change in color when the display unit is mounted vertically, each LED lamp 50 must be mounted on a substrate 57 so that the two LED chips 54 and 55 are spaced in the vertical direction as shown in FIG. 6.

However, when an array of such LED lamps 50 is disposed in such a manner, there is a problem because the upper lead 52 of one LED lamp 50 and the lower lead 53 of the adjacent LED lamp 50 are so close, as shown by the letter A in FIG. 6, that they can interfere with each other and cause a short circuit. This problem presents a serious obstacle to reduction of the spacing between adjacent LED lamps 50 on the substrate 56 in order to improve the visual appearance of the display unit.

To avoid this problem, a conventional arrangement has LED lamps 50 which are oriented in a display unit so that the direction of the spacing between the pairs of LED chips 54 and 55 is inclined from the vertical as shown in FIG. 7. In this way, a short circuit is prevented from occurring between adjacent pairs of LED lamps 50.

If this arrangement is used, however, there is a basic problem in the display because the display color of the LED lamp 50 changes in accordance with the direction of viewing as mentioned above. In particular, a display unit having the arrangement shown in FIG. 7 has a display color which is strong in green if the display unit is viewed from the right, while the display unit has a display color which is strong in red if the display unit is viewed from the left. Therefore, there is not only the problem that the uniformity of color is spoiled because of the variation in color depending on the direction of viewing, but also the problem that the display looks unattractive or the appearance is degraded.

SUMMARY OF THE INVENTION

Accordingly, it is an object of the present invention to provide an LED lamp and an arrangement for mounting LED lamps on a substrate which overcome the disadvantages of the prior art.

Another object of the invention is to provide a display unit which prevents short circuits from occurring between adjacent LED lamps while avoiding a change in display color and hence a deterioration in display appearance resulting from a variation in color depending on the direction of viewing while satisfying a requirement for a reduction in spacing between LED lamps on a substrate.

These and other objects of the invention are attained by providing an LED lamp arrangement including a first lead having a reflecting plate formed at one end, two further leads disposed on opposite sides of the first lead, and a plurality of LED chips mounted on the reflecting plate along a line which is inclined at a predetermined angle relative to a line extending between the first lead and the two further leads.

According to a second aspect of the present invention, the reflecting plate in the LED lamp is elongated in one direction to provide a long and narrow shape, the plurality of LED chips are spaced in the direction of elongation of the reflecting plate, and the direction of elongation of the reflecting plate is inclined at a predetermined angle relative to the line extending between the leads.

According to a third aspect of the present invention, the predetermined angle between the direction of spacing of the plurality of LED chips in the LED lamp relative to the line extending between the leads, i.e. the angle of the direction of elongation of the reflecting plate relative to the line extending between the leads, is from about 5 to about 85 degrees.

According to a fourth aspect of the present invention, an arrangement for mounting LED lamps on a substrate includes a plurality of LED lamps arranged in horizontal and vertical rows, each having a first lead carrying an elongated reflecting plate and a plurality of LED chips mounted on the reflecting plate which are spaced in the direction of elongation of the reflecting plate, and two further leads spaced on opposite sides of the first lead along a line extending at a predetermined angle to the direction of elongation of the reflecting plate, with the pluralities of LED chips in the LED lamps aligned in either the horizontal direction or the vertical direction of the array.

According to the first aspect of the present invention, the plurality of LED chips mounted on the reflecting plate at the end of the first lead extends at a predetermined angle relative to the direction of the line extending between first lead and the other leads. Accordingly, there is no possibility that a short circuit could occur between LED lamp leads adjacent to each other even if the plurality of LED lamps are mounted closer together and the orientation of the plurality of LED chips on each lamp is aligned with the vertical direction of the lamps in the array.

In particular, for example, when a plurality of LED lamps are arranged horizontally and vertically in an array, even if the direction of spacing of a plurality of LED chips in each lamp is the same as the vertical direction of the lamps in the array, the leads disposed on both sides of the reflecting plate in each lamp are not in line with the alignment of the lamps in the array, but are shifted by a predetermined distance from the line of the lamps. Therefore, the leads of two LED lamps which are adjacent to each other in the vertical direction are not in line in the vertical direction so that the spacing between the leads for adjacent lamps is increased.

Consequently, there is no risk that the adjacent leads of two adjacent LED lamps will interfere with each other even if the LED lamps are mounted extremely close to each other. Accordingly, a short circuit cannot occur between the leads.

Furthermore, even if the reflecting plate having a plurality of LED chips mounted thereon is, for example, circular rather than being elongated, a plurality of LED lamps can be arranged in a line if the mounting area for them is made large enough. However, taking into a consideration a requirement for miniaturizing the reflecting plate or a limit on the quantity of materials to be used for the portion where the reflecting plate is formed, it is preferable for the reflecting plate to be formed as in the manner described below.

That is, according to the second aspect of the present invention, the reflecting plate has a long and narrow shape which is elongated in one direction, for example, an ellipse or an oval, and a plurality of LED chips are spaced along the axis of elongation of the reflecting plate. In addition, the axis of elongation of the reflecting plate is inclined at a predetermined angle relative to the direction of spacing of the leads for the lamp, making it possible to reduce the chip mounting area of the reflecting plate to a minimum. In addition, since the distance between the LED chips and the reflecting surface at the peripheral edge portion of the reflecting plate is no greater than necessary, it is possible to obtain improved reflection.

From geometric considerations, if the angle of inclination of the line of LED chips or the angle of inclination of the axis of elongation of the reflecting plate relative to the direction of spacing of the LED leads is from about 5 to about 85 degrees, according to the third aspect of the invention, it is possible to assure that there will be no interference between leads of adjacent lamps which are close to each other. In particular, as mentioned above, a short circuit may occur between vertically adjacent LED lamps when the inclination angle is zero, and a short circuit may occur between horizontally adjacent LED lamps when the inclination angle is 90 degrees. Therefore, a suitable inclination angle which can avoid both these disadvantages is from about 5 degrees to about 85 degrees as mentioned above.

On the other hand, according to the fourth aspect, the present invention is particularly effective in manufacturing an LED dot matrix display unit by using a plurality of LED lamps according to any of the first to third aspects of the present invention. That is, a plurality of LED lamps are arranged on a substrate horizontally and vertically so as to form a display unit, and the display unit is installed so that the substrate is in a vertical plane. In addition, the plurality of LED lamps are mounted on the substrate so that the direction of spacing of the LED chips in the LED lamps is in either the longitudinal direction or the transverse direction of the substrate, which is oriented in the vertical direction in the display. Consequently, the direction of a line extending between the leads of the plurality of LED lamps is inevitably inclined at a predetermined angle to the longitudinal or the transverse direction of the substrate which will be in the vertical direction when installed in the display.

As a result, the display color does not change when the display unit is viewed from the left and viewed from the right. Accordingly, not only is it possible to avoid variations in coloring caused by a difference in viewing direction, but also it is possible to prevent a short circuit from occurring between adjacent LED lamps. In addition, it is possible to make the pitch between adjacent LED lamps small, and it is possible to provide a fine display mode for the display unit, so that visual recognition can be improved.

BRIEF DESCRIPTION OF THE DRAWINGS

Further objects and advantages of the invention will be apparent from a reading of the following description in conjunction with the accompanying drawings, in which.

DETAILED DESCRIPTION OF PREFERRED EMBODIMENTS

A preferred embodiment of the present invention will be described specifically with reference to the drawings.

Figure 1:
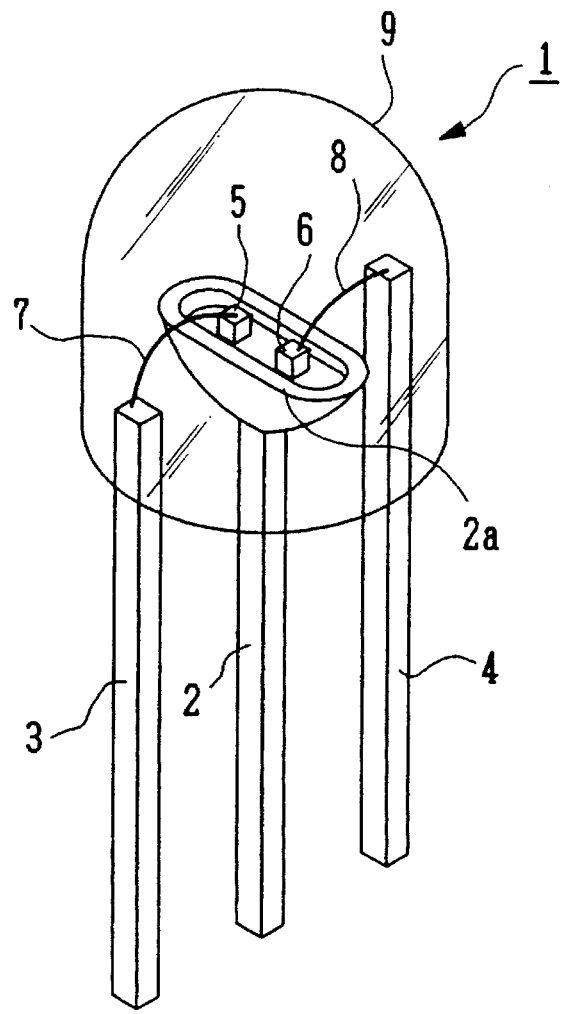
FIG. 1 is a schematic perspective view illustrating a representative embodiment of an LED lamp arranged according to the present invention.

FIG. 1 is a perspective view illustrating a typical embodiment of an LED lamp 1 arranged according to the present invention. As shown in the drawing, the LED lamp 1 has a first lead pin 2 on which a reflecting plate 2a is formed at the upper end and two further lead pins 3 and 4 disposed in line on opposite sides of the lead pin 2. Two LED chips 5 and 6, the luminescent colors of which are red and green respectively, are bonded to the bottom portion of the reflecting plate 2a and are electrically connected with the lead pins 3 and 4 through corresponding wires 7 and 8, respectively.

The reflecting plate 2a has a long and narrow shape which is elongated in one direction, such as an ellipse or an oval, and the LED chips 5 and 6 are spaced along the axis of elongation of the reflecting plate 2a. The region surrounding the reflecting plate 2a and the upper ends of the other lead pins 3 and 4 is enclosed in a sealing body 9 made of transparent resin, colored transparent resin, dispersing agent containing resin, or the like.

Figure 2:
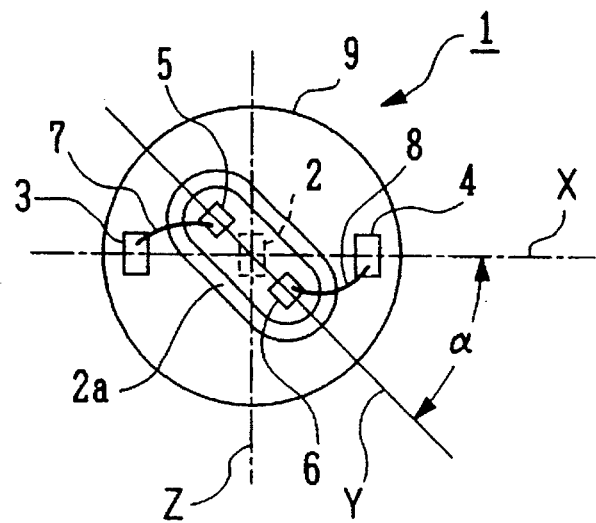
FIG. 2 is a schematic plan view illustrating the arrangement of the LED lamp shown in FIG. 1.

In accordance with the present invention, as shown in FIG. 2, the axis of elongation of the reflecting plate 2a is inclined at a predetermined angle α relative to the direction of spacing of the lead pins 3 and 4. In particular, a straight line Y extending along the axis of elongation of the reflecting plate 2a is inclined at a predetermined angle α relative to a straight line X connecting the upper ends of the three lead pins 2–4. Therefore, the direction of spacing of the LED chips 5 and 6 is also inclined at the predetermined angle α relative to the straight line X connecting the upper ends of the respective lead pins 2–4.

Preferably, the inclination angle α of the straight line Y with respect to the straight line X is from 5 degrees to 85 degrees. That is, the direction of spacing of the LED chips 5 and 6 has a displacement angle of at least 5 degrees relative to the direction of spacing of the lead pins 2–4, and has a displacement angle of at least 5 degrees to a direction Z perpendicular to the direction of spacing of the lead pins 2–4.

Figure 3:
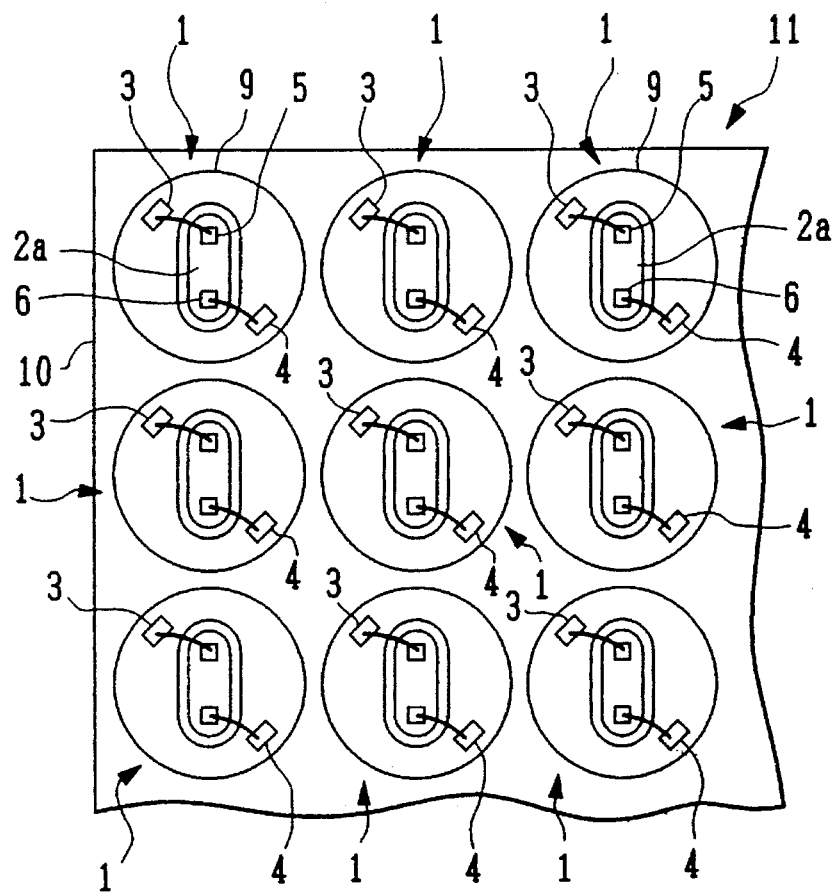
FIG. 3 is a fragmentary schematic plan view illustrating a portion of an array of the LED lamps of FIG. 1 mounted on a substrate.

When an LED dot matrix display unit is manufactured using a plurality of such LED lamps 1, an array of LED lamps 1 is arranged on a substrate 10 in lines extending in the longitudinal and transverse directions as shown in FIG. 3. In each of the LED lamps 1, the lead pins 2–4 are soldered onto the substrate 10 so that the direction of spacing of the LED chips 5 and 6 is the same as the longitudinal direction of the array, that is, so that the LED chips 5 and 6 are arranged in the longitudinal direction. Accordingly, straight lines corresponding to the longitudinal directions of the reflecting plates 2a of the LED lamps 1 are necessarily also arranged in the same longitudinal lines as the lamps in the array.

In this case, the direction of spacing of the respective lead pins 2–4 is inclined at the predetermined angle α in the same direction for all the LED lamps 1. In other words, the direction of spacing of the lead pins 2–4 of the LED lamps 1 are all inclined at the same angle but it is not always necessary to incline the respective lead pins 2–4 of all the LED lamps 1 at the same angle. Provided that the directions of spacing of the lead pins 2–4 of the LED lamps 1 are all individually inclined with respect to the direction of spacing of the LED chips, the present invention can be carried out even if the angle of inclination is different in every case.

For example, with an array of LED lamps 1 arranged on 16 lines longitudinally and 16 lines transversely, providing 256 LED lamps in total, or an array of lamps arranged on 24 lines longitudinally and 24 lines transversely providing 576 LED lamps in total, all mounted on the single substrate 10 shown in FIG. 3, a matrix unit 11 which is a unit module is provided. Further, a plurality of such matrix units 11 are connected in the transverse and/or longitudinal directions, so as to obtain an LED dot matrix display unit to be used as a display board or the like.

When mounted in a vertical plane such as on a wall or the like, this LED dot matrix display unit is positioned so that its front surface lies in a vertical plane. Further, the LED dot matrix display unit is oriented so that the respective LED chips 5 and 6 shown in FIG. 3 are arranged in the vertical direction.

If the display unit is used in this condition, even if the luminescent colors of the two LED chips 5 and 6 of the respective LED lamps 1 are different, the two LED chips 5 and 6 are oriented to produce the same effect regardless whether the display unit is viewed from the right or from the left. Consequently, the appearance of the display colors from the LED lamps 1 is not changed by a change in the direction of viewing, so that it is possible to provide a uniform display color and appearance, and hence improve the overall display.

Further, as is apparent from the arrangement of the respective LED lamps 1 shown in FIG. 3, the distance between two lead pins 3 and 4 of two LED lamps 1 which are adjacent to each other in the vertical and horizontal directions respectively and which should be close to each other is increased sufficiently that there is no risk that the lead pins 3 and 4 can interfere with each other. Accordingly, although the LED chips 5 and 6 are spaced along the same longitudinal line as the LED lamps in the array, there is no place where a short circuit can occur between LED lamps 1 which are adjacent to each other.

Figure 4:
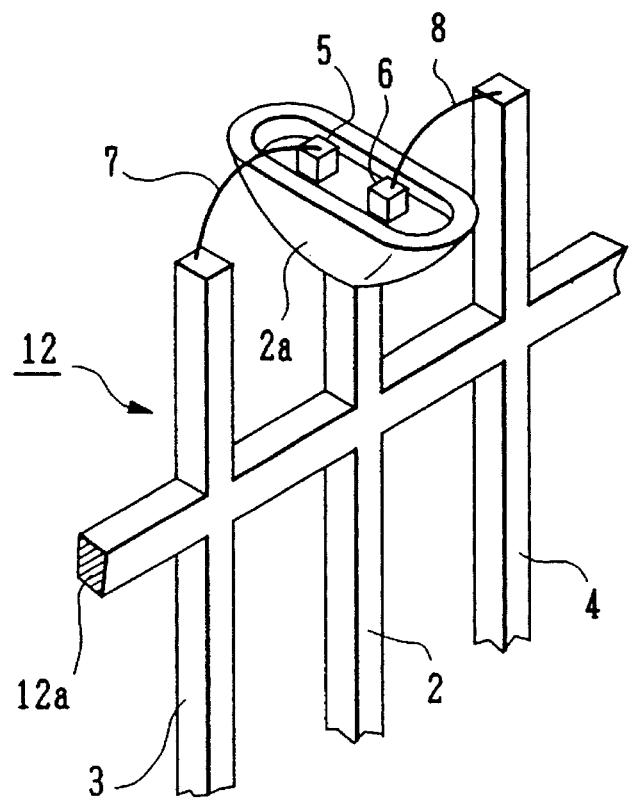
FIG. 4 is a schematic perspective view illustrating a stage in the manufacture of the LED lamp.
Figure 5:
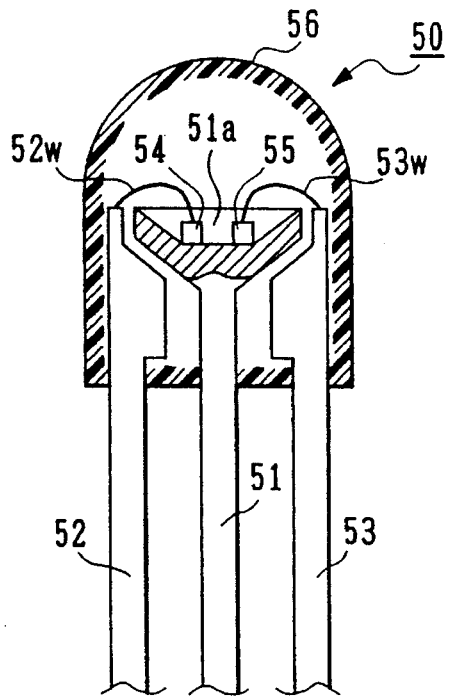
FIG. 5 is a cross-sectional view illustrating the structure of a conventional LED lamp.
Figure 6:
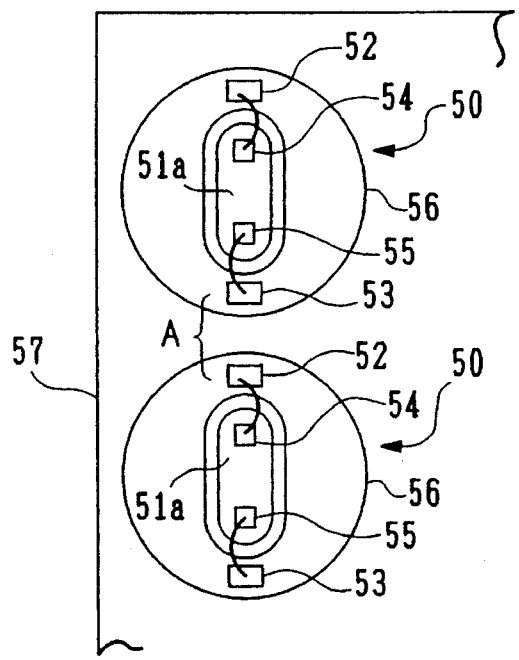
FIG. 6 is a fragmentary schematic plan view illustrating one example of two adjacent conventional LED lamps in an array mounted on a substrate.
Figure 7:
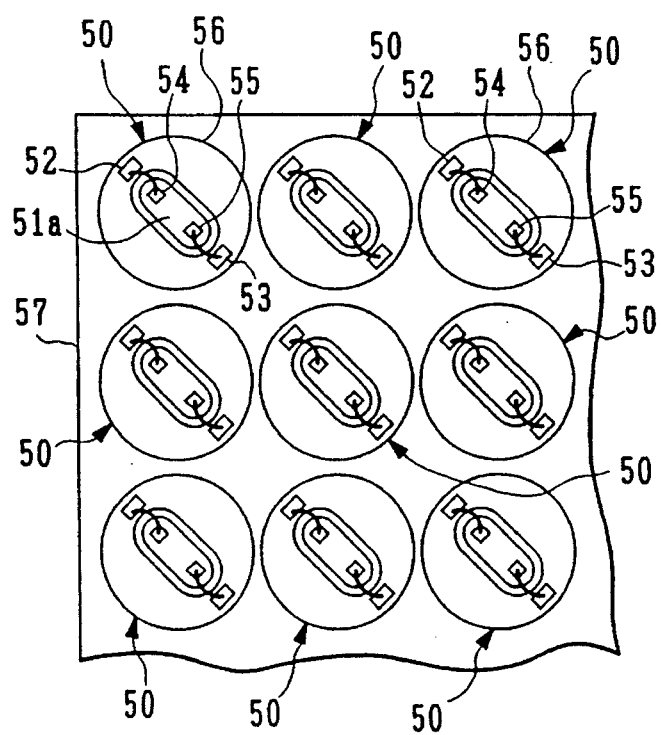
FIG. 7 is a fragmentary schematic plan view illustrating another example of conventional LED lamps in an array mounted on a substrate.

Although the method of manufacturing the above-mentioned LED lamp 1 is not limited to any particular method, in a lead frame 12 in which respective lead pins 2–4 are coupled through a tie bar 12a as shown in FIG. 4 and their lower ends are further coupled through a support bar (not shown), a typical method includes pressing and rolling by using a tapping or punching tool on the end of the lead pin 2, so as to form an inclined reflecting plate 2a. This process of forming a reflecting plate 2a may be carried out by pressing only the end of the pin 2 to form a transverse reflecting plate 2a, or it may be carried out by first pressing to form a reflecting plate 2a that is not transverse to the pin and thereafter twisting the reflecting plate 2a around its central axis so as to form a transverse reflecting plate 2a.

Thereafter, two LED chips 5 and 6 are bonded onto the bottom portion of the reflecting plate 2a, and the LED chips 5 and 6 and the upper ends of the lead pins 3 and 5 are electrically connected by wires 7 and 8 respectively. After that, a sealing body 9 consisting of resin is formed around the reflecting plate 2a by casting in a mold, and finally the tie bar 12a (and the support bar) is cut off, so as to obtain the LED lamp 1 shown in FIG. 1.

Although the invention has been described herein with respect to specific embodiments, many modifications and variations therein will readily occur to those skilled in the art. For example, the described embodiments include an LED lamp having an elongated reflecting plate 2a but the invention is not limited to this shape of the reflecting plate 2a so long as the direction of spacing of the LED chips 5 and 6 mounted thereon is inclined at a predetermined angle relative to the direction of spacing of the leads 2–4. Moreover, the described embodiments have an LED lamp containing two LED chips 5 and 6 mounted on a reflecting plate 2a but the invention can be applied to an LED lamp containing three or more LED chips. Accordingly, all such variations and modifications are included within the intended scope of the invention.

What is claimed is:

1. An LED lamp arrangement comprising a first lead having a reflecting plate formed at one end, two further leads spaced on opposite sides of the first lead, and a plurality of LED chips mounted in linearly spaced relation on the reflecting plate, wherein a direction of linear spacing of the plurality of LED chips is inclined at a predetermined angle relative to a direction of spacing of the two further leads.

2. An LED lamp according to claim 1 wherein the reflecting plate has an elongated shape and the plurality of LED chips are arranged in a direction of elongation of the reflecting plate, and wherein the direction of elongation of the reflecting plate is inclined at a predetermined angle relative to the direction of spacing of the two further leads.

3. An LED lamp according to claim 1 wherein the inclination angle is in a range of from about 5 to about 85 degrees.

4. An LED lamp arrangement comprising a substrate and a plurality of LED lamps each comprising a first lead having a reflecting plate formed at one end, two further leads spaced on opposite sides of the first lead, and a plurality of LED chips mounted in linearly spaced relation on the reflecting plate, wherein a direction of linear spacing of the plurality of LED Chips is inclined at a predetermined angle relative to a direction of spacing of the two further leads, wherein the plurality of LED lamps are arranged in a longitudinally and transversely extending array on the substrate.

5. An LED lamp arrangement according to claim 4 wherein the directions of spacing of the LED chips in each of the LED lamps coincide with a longitudinal direction of the array of lamps on the substrate.

6. An LED lamp arrangement according to claim 4 wherein the directions of spacing of the LED chips in each of the LED lamps coincide with a transverse direction of the array of lamps on the substrate.

* * * * *